(12) United States Patent
Motegi et al.

(10) Patent No.: US 6,882,175 B2
(45) Date of Patent: Apr. 19, 2005

(54) INTER-BLOCK INTERFACE CIRCUIT AND SYSTEM LSI

(75) Inventors: Isao Motegi, Yokohama (JP); Eiji Nagata, Kawasaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 40 days.

(21) Appl. No.: 10/460,175

(22) Filed: Jun. 13, 2003

(65) Prior Publication Data

US 2004/0010726 A1 Jan. 15, 2004

(30) Foreign Application Priority Data

Jul. 11, 2002 (JP) ........................................ 2002-202850

(51) Int. Cl.[7] ...................... H03K 17/16; H03K 19/003
(52) U.S. Cl. ............................. 326/31; 326/80; 326/26
(58) Field of Search ............................. 326/22, 26, 31, 326/33, 80, 82

(56) References Cited

U.S. PATENT DOCUMENTS

| 5,583,457 | A | * | 12/1996 | Horiguchi et al. ........... 326/121 |
| 6,208,171 | B1 | * | 3/2001 | Kumagai et al. ............. 326/121 |
| 6,256,252 | B1 | | 7/2001 | Arimoto |
| 6,275,096 | B1 | | 8/2001 | Hsu et al. |

FOREIGN PATENT DOCUMENTS

| CN | 1320889 | 11/2001 |
| JP | 56112123 | 9/1981 |
| JP | 61081660 | 4/1986 |
| JP | 61134821 | 6/1986 |
| JP | 02003272 | 1/1990 |
| JP | 05165551 | 7/1993 |
| JP | 10084274 | 3/1998 |
| JP | 2000207884 | 7/2000 |
| JP | 2000299436 | 10/2000 |
| JP | 2001-093275 | 4/2001 |
| WO | WO 98/51012 | 11/1998 |

OTHER PUBLICATIONS

English Language Abstract of JP Appln. No. 2001-093275, Apr. 2001.
English Language Abstract of JP Appln. No. 2000-299436, Oct. 2000.
English Language Abstract of JP Appln. No. 2000-207884, Jul. 2000.
English Language Abstract of JP Appln. No. 10-084274, Mar. 1998.
English Language Abstract of JP Appln. No. 05-165551, Feb. 1993.
English Language Abstract of JP Appln. No. 02-003272, Jan. 1990.
English Language Abstract of JP Appln. No. 61-134821, Jun. 1986.
English Language Abstract of JP Appln. No. 61-081660, Apr. 1986.
English Language Abstract of JP Appln. No. 56-112123, Sep. 1981.

* cited by examiner

*Primary Examiner*—Daniel D. Chang
(74) *Attorney, Agent, or Firm*—Greenblum & Bernstein, P.L.C.

(57) ABSTRACT

An inter-block interface circuit which effectively prevents occurrences of inconveniences (for example, such that a shoot-through current flows due to unsteady potential in wiring) caused by switching off a power supply of a block, using simple circuitry, in LSI such that signals are communicated between the blocks and the power supplies of the blocks are interrupted independently. In the circuit, gate circuits 112 and 114 are respectively provided in blocks 102 and 104 that communicate signals with one another, and interface control circuit 202 dynamically controls respective input levels of gate circuits 112 and 114. In other words, the circuit 202 fixes an input level of gate circuit 112 or 114 in a block whose power supply is ON to "L", and thereby compulsively fixes an output level of the gate circuit to "L".

6 Claims, 12 Drawing Sheets

INTER-BLOCK INTERFACE CIRCUIT AND SYSTEM LSI

BACKGROUND OF THE INVENTION

1. Field of the Invention

The present invention relates to an inter-block interface circuit and system LSI.

2. Description of the Related Art

There are techniques for setting circuitry for low power consumption mode to reduce power consumption in apparatuses such cellular telephones that demand severe decreases in power consumption.

In general, the power consumption becomes zero when the power supply of the entire circuitry is completely interrupted, but waiting time is necessary to enable the circuitry to operate when the power supply is turned on again.

Accordingly, in the low power consumption mode, it is general to set circuitry for non-operation state (for example, by interrupting a signal input to prohibit level changes in signal line) or to suspend power supply in part of the circuitry, instead of turning off the power supply of the entire circuit (for example, an entire macro-block).

In recent years, increases in scale in system LSI have been progressed, and such a tendency has been pronounced that a plurality of different types of circuits that are conventionally constructed as IC individually is integrated onto a single semi-conductor substrate.

Increasing the scale in system LSI is extremely effective in reducing the packing area, and as the size is reduced, further decreases in power consumption are expected. For example, in mobile terminals such as cellular telephones, the battery life is decreased corresponding to accelerated increases in multifunctionality and rate, and market demands for low power consumption become more severe.

Thus, in large-scale system LSI mounted on devices such as mobile terminals, there is a fear that following conventional low power consumption mode techniques cannot adequately respond to the demands for decreases in power consumption.

Therefore, beyond conventional common sense, the inventor of the present invention examined enhancement in power consumption reducing function by precisely controlling power supply in each of a plurality of different types of blocks (macroblocks) integrated on a system LSI to implement turning off the entire block.

In the case of a system LSI, since a plurality of different types of functional blocks are packaged, there is a high possibility that blocks are present which do not need to be ON at the same time corresponding to usage of the blocks and necessity of cooperation of the blocks, and therefore, it is considered to enable increases in power consumption reduction effect by controlling the power supplies of such blocks precisely to turn off timely.

Further, since in recent years there have been power supply voltages under 3V and decreases in power supply voltage are remarkable as compared to times when 5V power supply is uniformly used, the time required for the voltage to reach a predetermined value is reduced even when the power supply that has been turned off once is turned on, and in this respect, controlling ON/OFF of the power supply of each block is considered as taking advantages.

However, when turning on or off the power supply of each block independently, for example, in the case where a path is present to communicate signals between adjacent blocks, suspension of all the circuits of blocks whose power supplies are turned off causes the potential of the path to be unsteady, and there is a fear that such unsteady potential causes two transistors composing a CMOS inverter to be ON at the same time and the shoot-through current is thus generated.

As measures against such a case, there is known a technique for providing a signal path with a gate circuit to compulsively fix an output of the gate circuit. In order to use such a technique, a power supply that is always ON (i.e. a power supply that is not switched on or off) is necessary.

However, the presence of the always-ON power supply is contradictory to the demands for power consumption reduction, and carrying out wiring of such a power supply (power supply wiring) increases restrictions in layout and also causes increases in chip size.

Further, since each block packaged on a single substrate is switched on or off at irregular intervals, the relative relationship between a switched-off block and switched-on block changes always, which is an obstacle to taking measures.

SUMMARY OF THE INVENTION

It is an object of the present invention to provide an inter-block interface circuit and system LSI which effectively prevent occurrences of inconveniences (for example, such that a shoot-through current flows due to unsteady potential in wiring) caused by switching off the power supply of a block, using simple circuitry, in LSI in which signals are communicated between blocks and the power supply of each of the blocks is interrupted independently.

According to an aspect of the invention, an inter-block interface circuit is provided to prevent an occurrences of unsteady potential state in a predetermined portion on a signal path through which a signal is communicated between a plurality of different types of blocks packaged on a substrate in controlling for each block ON/OFF of power supplies of the plurality of different types of blocks, and has a pair of gate circuits composed of a first gate circuit which is provided in a first block that transmits a signal and which operates by a power supply of the first block, and a second gate circuit which is provided in a second block that receives the signal and which operates by a power supply of the second block, and a circuit that has a function of compulsively fixing an input level of the first gate circuit or the second gate circuit respectively provided in the first block or the second block whose power supply is ON, using the power supply of the block which is ON, when the power supply of either the first block or second block is ON and the power supply of the other block is OFF, and thus compulsively fixing potential of an output terminal of the gate circuit.

BRIEF DESCRIPTION OF THE DRAWINGS

The above and the other objects and features of the invention will appear more fully hereinafter from a consideration of the following description taken in connection with the accompanying drawing wherein one example is illustrated by way of example, in which;

FIG. 2A is a diagram to illustrate a configuration of an inter-block interface circuit in the first embodiment and operation in the circuit in a state where the power supply of a block that transmits a signal is switched off and the power supply of a block that receives the signal is switched on;

FIG. 4A is a diagram to illustrate a configuration of an inter-block interface circuit in the second embodiment and operation in the circuit in a state where the power supply of a block that transmits a signal is switched off and the power supply of a block that receives the signal is switched on;

FIG. 6A is a diagram to illustrate a configuration of an inter-block interface circuit in the third embodiment and operation in the circuit in a state where the power supply of a block that transmits a signal is switched off and the power supply of a block that receives the signal is switched on;

FIG. 7A is a diagram to illustrate an example of a configuration of a pair of gate circuits composing an inter-block interface circuit and characteristic circuitry operation in the case where the power supply of a block that transmits a signal is switched off and the power supply of a block that receives the signal is switched on;

FIG. 8A is a diagram to illustrate another example of a configuration of a pair of gate circuits composing an inter-block interface circuit and characteristic circuitry operation in the case where the power supply of a block that transmits a signal is switched off and the power supply of a block that receives the signal is switched on;

FIG. 9A is a diagram to illustrate another example of a configuration of a pair of gate circuits composing an inter-block interface circuit and characteristic circuitry operation in the case where the power supply of a block that transmits a signal is switched off and the power supply of a block that receives the signal is switched on;

FIG. 10A is a diagram to illustrate another example of a configuration of a pair of gate circuits composing an inter-block interface circuit and characteristic circuitry operation in the case where the power supply of a block that transmits a signal is switched off and the power supply of a block that receives the signal is switched on;

FIG. 11A is a diagram to illustrate another example of a configuration of a pair of gate circuits composing an inter-block interface circuit and characteristic circuitry operation in the case where the power supply of a block that transmits a signal is switched off and the power supply of a block that receives the signal is switched on;

FIG. 12A is a diagram to illustrate another example of a configuration of a pair of gate circuits composing an inter-block interface circuit and characteristic circuitry operation in the case where the power supply of a block that transmits a signal is switched off and the power supply of a block that receives the signal is switched on.

DETAILED DESCRIPTION OF THE PREFERRED EMBODIMENTS

Embodiments of the present invention will be described below specifically with reference to accompanying drawings.

(First Embodiment)

Figure 1:
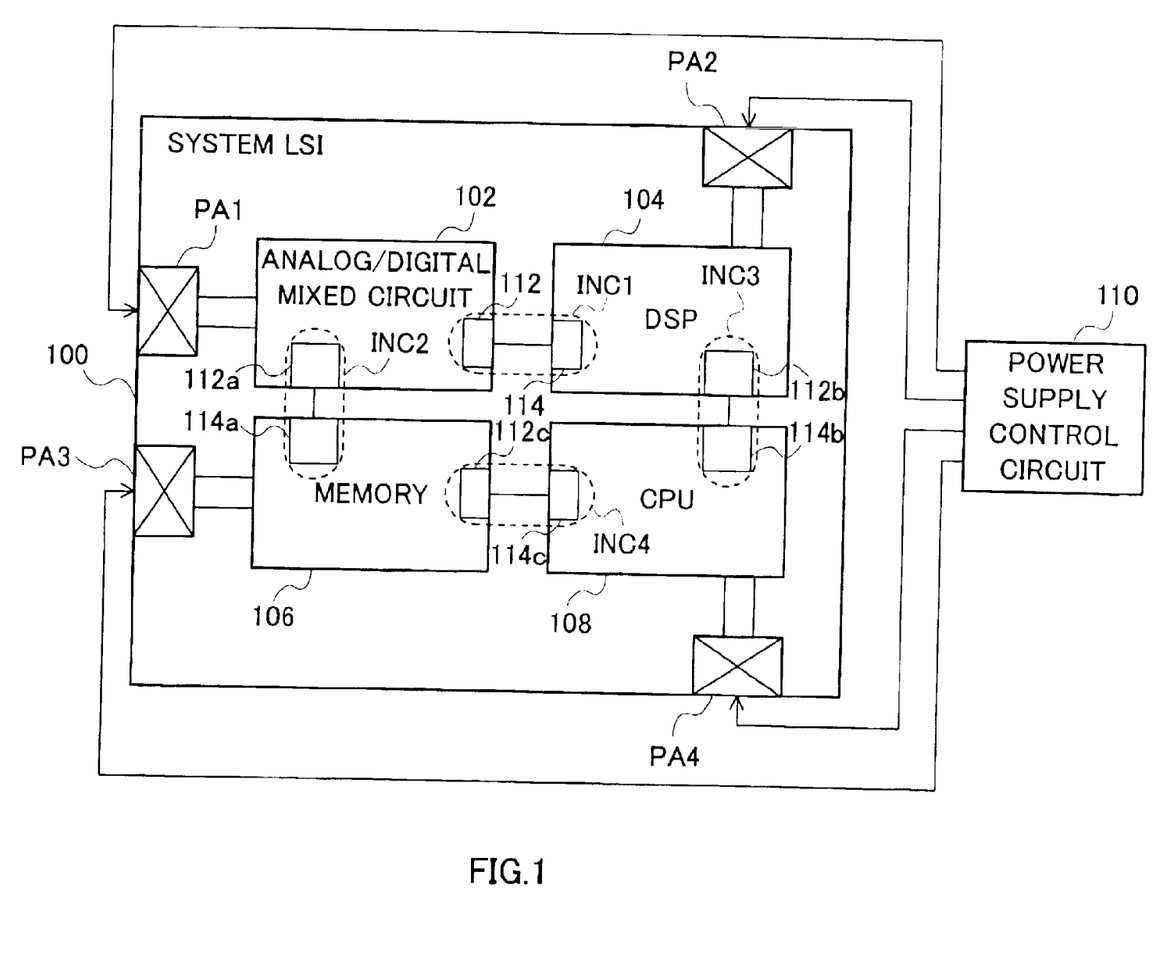
FIG. 1 is a block diagram illustrating an entire configuration of system LSI and power supply system according to a first embodiment of the present invention.

FIG. 1 is a diagram illustrating an entire configuration of system LSI and power supply system according to the first embodiment of the present invention.

As illustrated in FIG. 1, on system LSI (system LSI chip) 100 are packaged analog/digital mixed circuit 102, DSP block 104, memory block 106 and CPU block 108.

Analog/digital mixed circuit 102, DSP block 104, memory block 106 and CPU block 108 are respectively provided with power supply pads PA1, PA2, PA3 and PA4. Power supply control circuit (power supply control LSI) 110 supplies the power supply voltage to the blocks 102, 104, 106 and 108 respectively through power supply pads PA1 to PA4.

Power supply control circuit (power supply control LSI) 110 controls on/off of the blocks 102, 104, 106 and 108 independently. For example, power supply control circuit 110 is applied to a TDD (Time Division Duplex) cellular telephone, the power supply of a transmission circuit (for example, which belongs to analog/digital mixed circuit 102) of the telephone is switched off at communication timing of a communicating party. Further, when power supply control circuit 110 is applied to a portable terminal that controls a home network, the power supplies of blocks except a block that has functions required for the control are switched off.

In the blocks 102, 104, 106 and 108 in FIG. 1, the blocks mutually communicate signals. In FIG. 1, each of four portions, INC1, INC2, INC3 and INC4, surrounded by dotted lines, is a pair of gate circuits that composes an inter-block interface circuit of the present invention. A pair of gateway circuits INC1 has two gate (AND gate) circuits, 112 and 114. As in a pair of gate circuits INC1, a pair of gate circuits INC2 has two gate circuits, 112a and 114a, a pair of gate circuits INC3 has two gate circuits, 112b and 114b, and a pair of gate circuits INC4 has two gate circuits, 112c and 114c.

The configuration and operation of the inter-block interface circuit of this embodiment will be described below with reference to FIGS. 2A and 2B. For convenience of explanation, the figures show the inter-block interface circuit between blocks 102 and 104. The configurations and operations of the other inter-block interface circuits are the same.

Figure 2A:
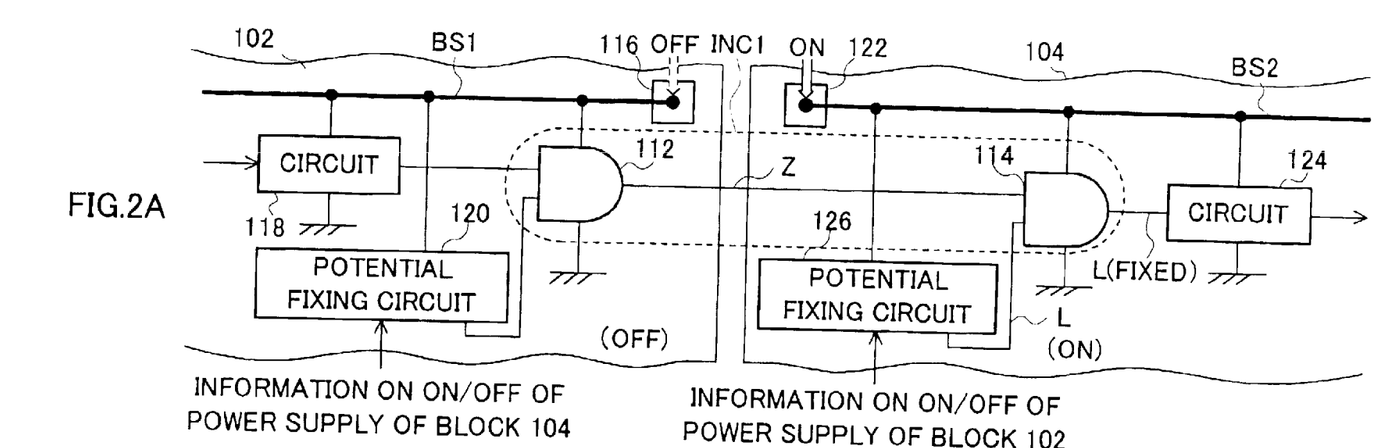
Figure 2B:
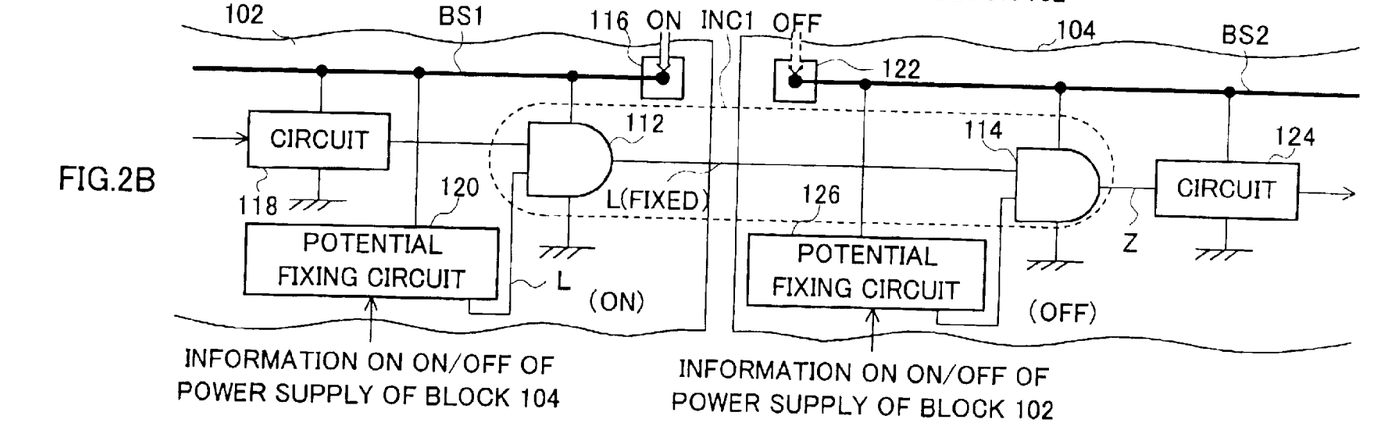
FIG. 2B is a diagram to illustrate the configuration of the inter-block interface circuit in the first embodiment and operation in the circuit in a state where the power supply of a block that transmits a signal is switched on and the power supply of a block that receives the signal is switched off.

FIG. 2A illustrates a state where the power supply of block 102 as a signal transmitting side is switched off and the power supply of block 104 as a signal receiving side is switched on, and FIG. 2B illustrates a state where the power supply of block 102 as a signal transmitting side is switched on and the power supply of block 104 as a signal receiving side is switched off.

As shown in the figures, block 102 is provided with internal power supply wiring BS1, and block 104 is provided with internal power supply wiring BS2. In block 102, the power supply voltage from power supply pad PA1 shown in FIG. 1 is supplied to circuit 118, potential fixing circuit 120 and gate circuit 112 via internal power supply terminal 116 and internal power supply wiring BS1. Meanwhile, in block 104, the power supply voltage from power supply pad PA2 shown in FIG. 1 is supplied to circuit 124, potential fixing circuit 126 and gate circuit 114 via internal power supply terminal 122 and internal power supply wiring BS2.

Circuit 118 provided in block 102 transmits a signal to circuit 124 provided in block 104 via a pair of gate circuits (two gate circuits, 112 and 114).

In addition, in this embodiment, the pair of gate circuits INC1 is composed of a combination of two AND gates 112 and 114. Various variations are considered for a pair of gate circuits composing the inter-block interface circuit, and will be described in the fourth embodiment.

Each of potential fixing circuits 120 and 126 always detects the power supply voltage of the block to which the circuit belongs, receives ON/OFF information of the power supply of the other block (while a portion that generates the information is not shown, for example, the information is generated in a circuit that monitors ON/OFF of the power supply of each block), provides an output of low level (L) to gate circuits 112 and 114 when the power supply of the block is ON and the power supply of the other block is OFF, and thus compulsively fixes outputs of gate circuits 112 and 114 to the low level (L).

In addition, each of potential fixing circuits 120 and 126 provides an output of high level (H) to gate circuits 112 and 114 when power supplies of both the block and the other block are ON. In this way, circuit 118 in block 102 is capable of transmitting signals to circuit 124 in block 104 via a pair of gate circuits INC1 (two gate circuits 112 and 114) without restraint.

In FIG. 2A, since the power supply of block 102 is OFF, the potential at an output terminal of gate circuit 112 is in a high-impedance state (in the figure, denoted by Z).

However, since one input of gate circuit (AND gate) 114 in block 104 is fixed to the low level by the function of potential fixing circuit 126, the potential of the output terminal of gate circuit 114 is compulsively fixed to the low level.

In this way, the shoot-through current is assuredly prevented from flowing due to both transistors of a CMOS circuit (not shown) being ON at the same time.

Meanwhile, in FIG. 2B, since the power supply of block 102 is ON and the power supply of block 104 is OFF, the potential at an output terminal of gate circuit 114 in block 104 is in a high-impedance state (Z state).

In this case, when an input level of gate circuit 114 in non-operation is unsteady, there is a risk that a level of an output terminal of circuit 114 varies due to some factor or CMOS transistors become ON at the same time immediately after switching on the power supply of block 104, and thus the shoot-through current flows.

However, the output terminal of circuit 112 in block 102 is compulsively fixed to the low level (L). In this way, in circuit 124 in block 104 whose potential is unsteady because the power supply is OFF, even when the power is supplied again, there are no fears that the shoot-through current flows.

Thus, in the inter-block interface circuit of this embodiment, since the potential of a predetermined portion is fixed using the power supply (internal power supply) of the block that is ON while using a circuit with a simple configuration, it is not necessary to use a power supply that is always ON, and inconveniences do not occur such as increases in chip size and increases in power consumption due to lead wiring.

By using the inter-block interface of the present invention, it is possible to control ON/OFF of the power supply of each block in system LSI as shown in FIG. 1 without restraint and with security for each block, and to effectively reduce the power consumption of system LSI.

(Second Embodiment)

A configuration of system LSI and a configuration and operation of an inter-block interface circuit according to the second embodiment will be described below with reference to FIGS. 3 and 4.

Figure 3:
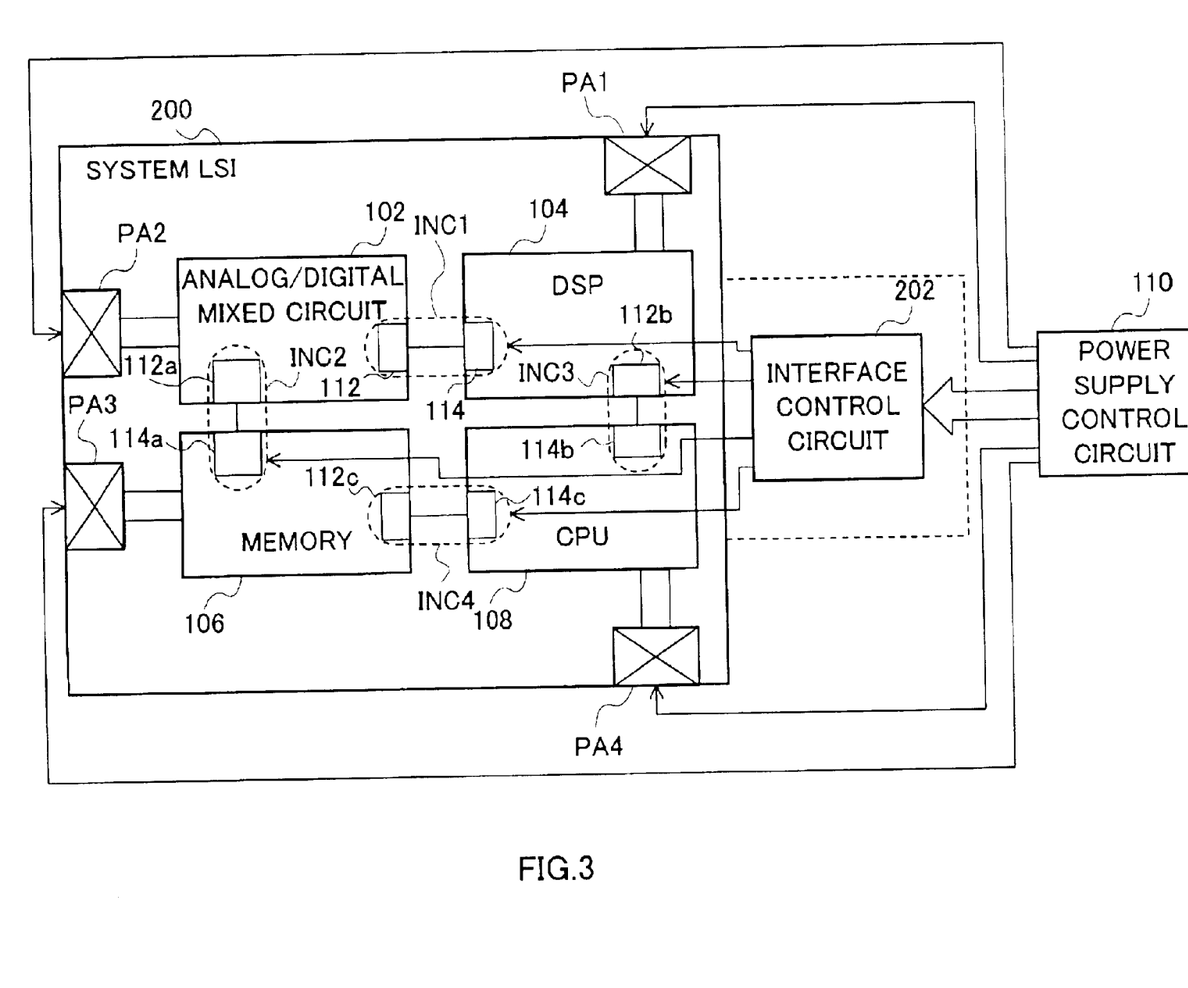
FIG. 3 is a block diagram illustrating a configuration of system LSI according to a second embodiment of the present invention.

A configuration of system LSI 200 in FIG. 3 is the same as that of system LSI 100 in FIG. 1 except that system LSI 200 has interface control circuit 202, and using control signals output from interface control circuit 202, compulsively fixes input levels of pairs of gate circuits INC1 to INC4 in inter-block interface circuits, respectively.

Interface control circuit 202 receives information on control of the power supply of each block from power supply control circuit (power supply control LSI) 110, and based on the information, generates a control signal.

In addition, while interface control circuit 202 is provided outside system LSI 200 in this embodiment, the circuit 202 may be provided inside system LSI 200.

Figure 4A:
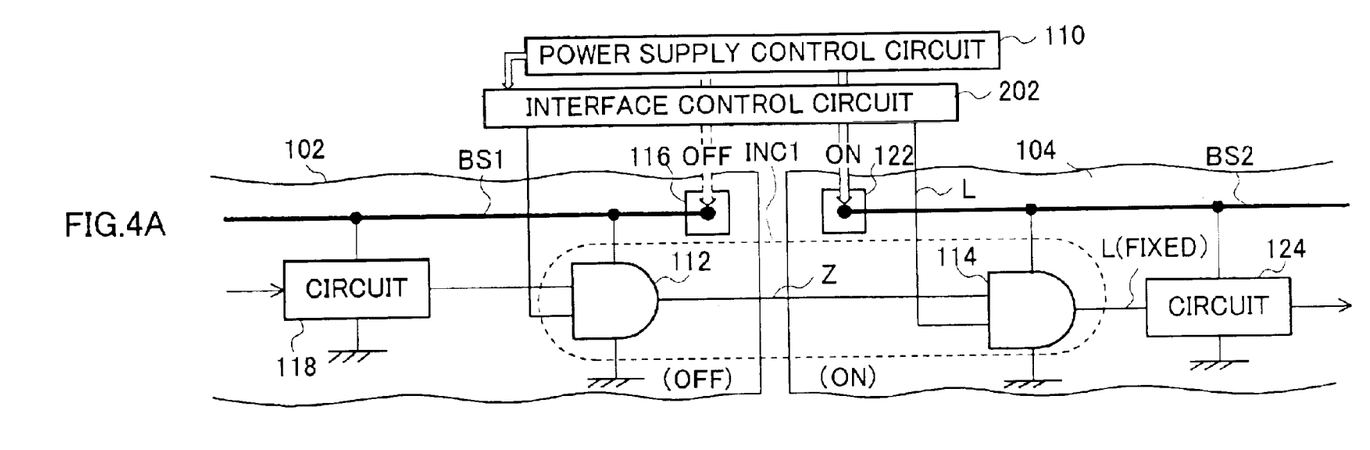

As shown in FIG. 4A, when the power supply of block 102 is OFF and the power supply of block 104 is ON, interface control circuit 202 fixes one input signal level of gate circuit 114 in block 104 to the low level.

In this way, even when the other input signal level is in a high-impedance state (unsteady potential), an output level of gate circuit (AND gate) 114 is fixed to the low level (L), thereby assuredly preventing the shoot-through current from occurring.

Figure 4B:
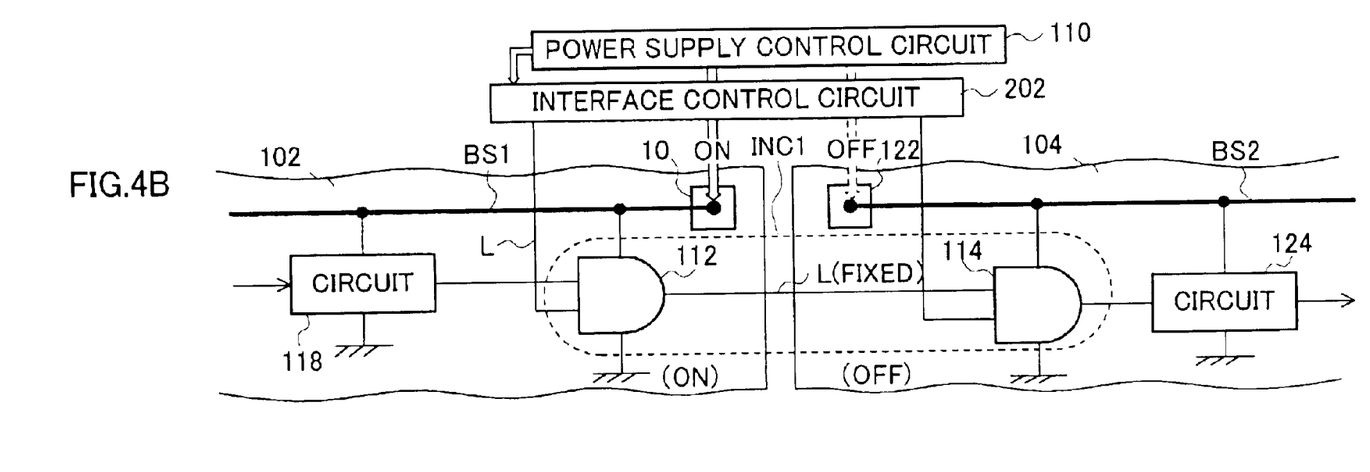
FIG. 4B is a diagram to illustrate the configuration of the inter-block interface circuit in the second embodiment and operation in the circuit in a state where the power supply of a block that transmits a signal is switched on and the power supply of a block that receives the signal is switched off.

Further, as shown in FIG. 4B, when the power supply of block 102 is ON and the power supply of block 104 is OFF, an output terminal of gate circuit 112 in block 102 is compulsively fixed to the low level (L). Thus, in circuit 124 in block 104 where the power supply is OFF and the potential is unsteady, there are no fears that the shoot-through current flows even when the power supply is switched on again.

In this embodiment, based on control information from power supply control circuit (power supply control LSI) 110, interface control circuit 202 is capable of controlling inputs of gate circuits of the inter-block interface circuit adaptively and extremely accurately.

(Third Embodiment)

A configuration of system LSI and a configuration and operation of an inter-block interface circuit according to the third embodiment will be described below with reference to FIGS. 5 and 6.

Figure 5:
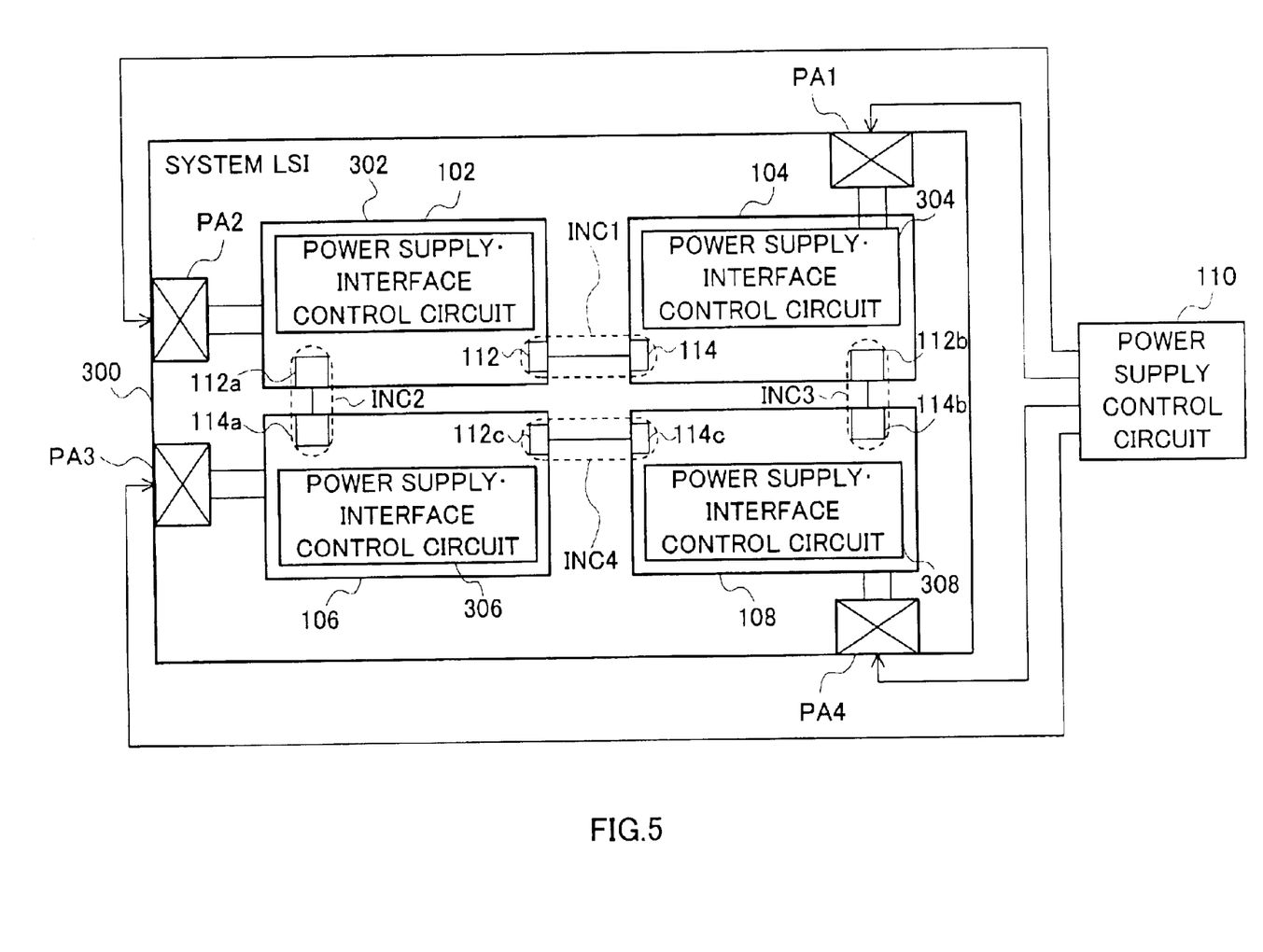
FIG. 5 is a block diagram illustrating a configuration of system LSI according to a third embodiment of the present invention.

A configuration of system LSI 300 in FIG. 5 is basically the same as that of system LSI 100 in FIG. 1 except that in system LSI, blocks 102, 104, 106 and 108 respectively have power supply•interface control circuits 302, 304, 306 and 308 to control both the power supply inside respective blocks and fixation of input levels of respective pairs of gate circuits.

Figure 6A:
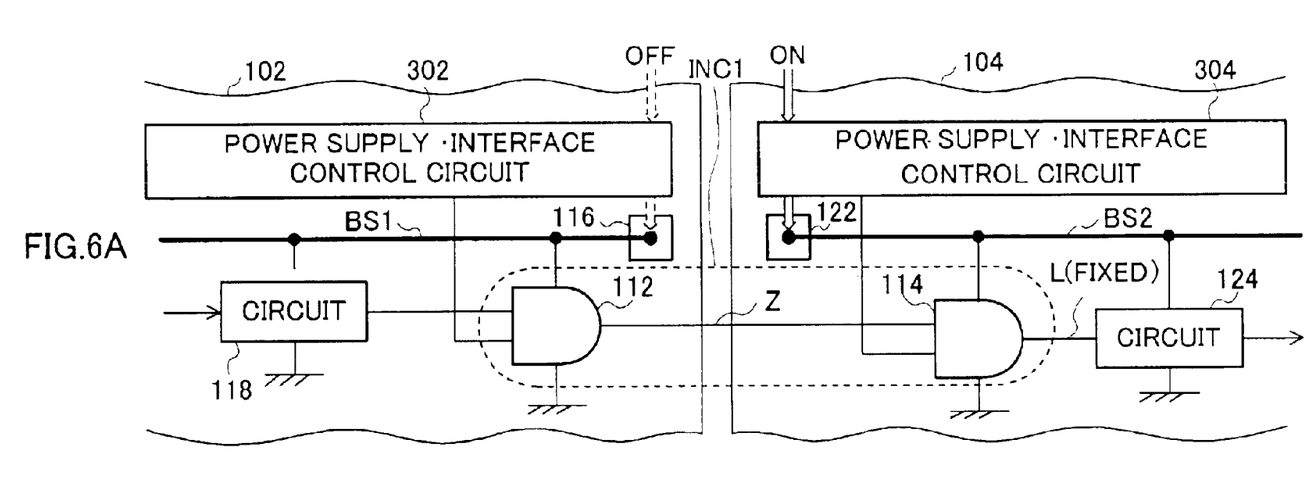

As shown in FIG. 6A, power supply•interface control circuits 302 and 304 control the supply and interruption of internal power supply voltage in blocks 102 and 104, respectively. Further, power supply•interface control circuits 302 and 304 control fixation of input levels of gate circuits 112 and 114.

When the power supply of block 102 is OFF and the power supply of block 104 is ON, power supply•interface control circuit 304 fixes one input signal level of gate circuit 114 in block 104 to the low level.

In this way, even when the other input signal level is in a high-impedance state (unsteady potential), an output level of gate circuit (AND gate) 114 is fixed to the low level (L), thereby assuredly preventing the shoot-through current from occurring.

Figure 6B:
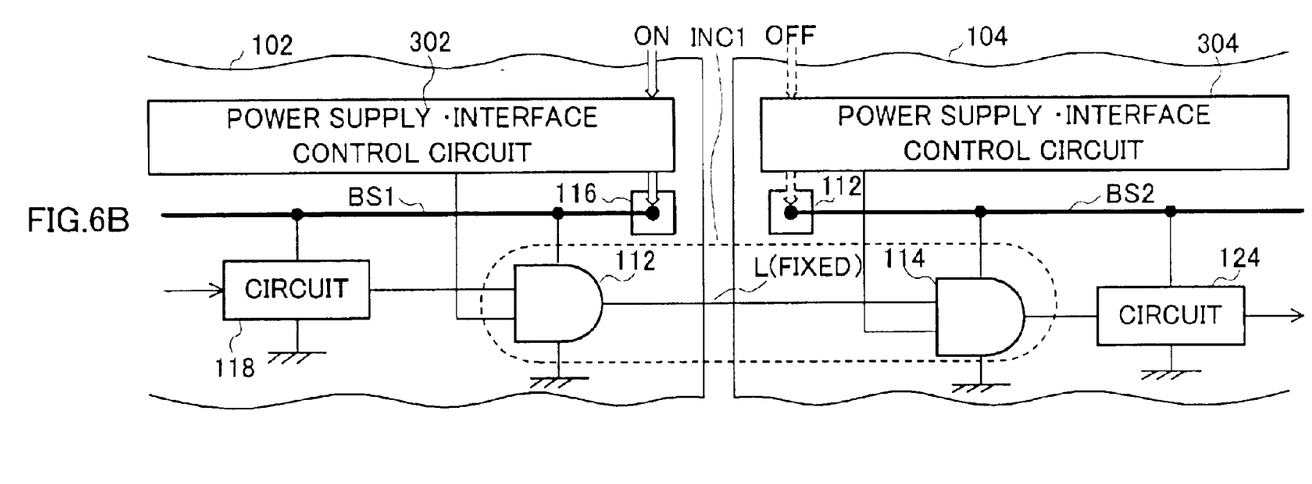
FIG. 6B is a diagram to illustrate the configuration of the inter-block interface circuit in the third embodiment and operation in the circuit in a state where the power supply of a block that transmits a signal is switched on and the power supply of a block that receives the signal is switched off.

Further, as shown in FIG. 6B, when the power supply of block 102 is ON and the power supply of block 104 is OFF, an output terminal of gate circuit 112 in block 102 is compulsively fixed to the low level (L).

Thus, in circuit 124 in block 104 where the power supply is OFF and the potential is unsteady, there are no fears that the shoot-through current flows even when the power supply is switched on again.

In addition, while examples in FIG. 5, FIG. 6A and FIG. 6B use both power supply control circuit (power supply control LSI) 110 and power supply interface control circuits 302, 304, 306 and 308 provided in respective blocks, a configuration may be adopted that power supply control circuit (power supply control LSI) 110 is given the same function as that of interface control circuit 202 in FIG. 3 and power supply•interface control circuits 302, 304, 306 and 308 in respective blocks are eliminated.

In this embodiment, since the circuit that controls the internal power supply of each block concurrently controls the inter-block interface circuit, there is an advantage that ON/OFF of the power supply of each block can be related to the control of the inter-block interface with ease and with accuracy.

(Fourth Embodiment)

FIGS. 7A, 7B, 8A, 8B, 9A, 9B, 10A, 10B, 11A, 11B, 12A and 12B are circuit diagrams showing various variations of a pair of gate circuits composing an inter-block interface circuit.

FIGS. 7A, 8A, 9A, 10A, 11A, and 12A show a state where block 102 is OFF and block 104 is ON as in FIG. 2A, while FIGS. 7B, 8B, 9B, 10B, 11B, and 12B show a state where block 102 is ON and block 104 is OFF as in FIG. 2B.

Figure 7A:
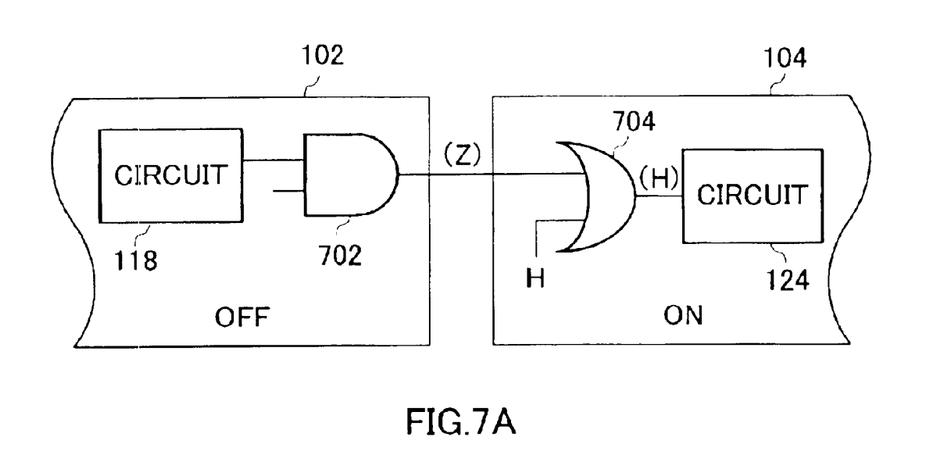
Figure 7B:
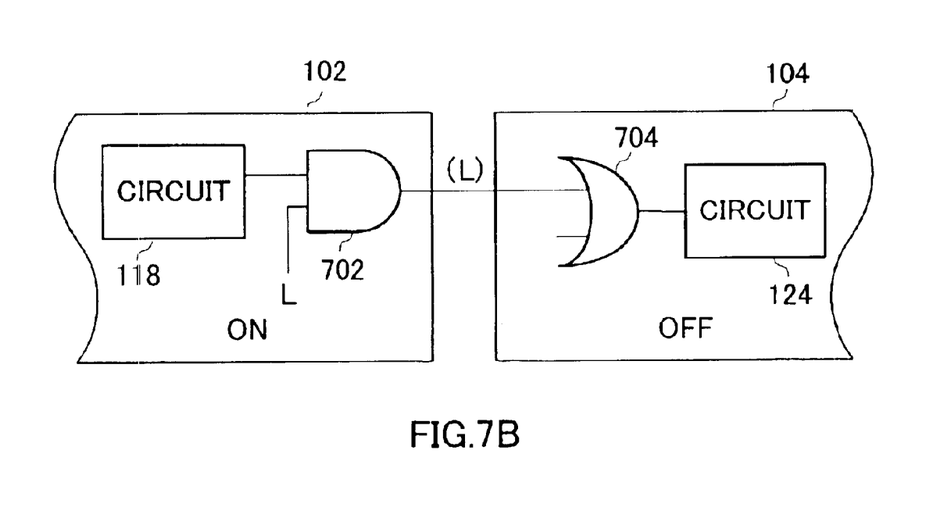
FIG. 7B is a diagram to illustrate the example of a configuration of a pair of gate circuits composing an inter-block interface circuit and characteristic circuitry operation in the case where the power supply of a block that transmits a signal is switched on and the power supply of a block that receives the signal is switched off.

In a pair of gate circuits as shown in FIGS. 7A and 7B, AND gate 702 and OR gate 704 are used as the pair of gate circuits.

In FIG. 7A, one input level of OR gate 704 is fixed to "H", and as a result, an output level of OR gate 704 is fixed to "H". In FIG. 7B, one input level of AND gate 702 is fixed to "L", and as a result, an output level of AND gate 702 is fixed to "L".

It is thereby possible to prevent occurrences of the shoot-through current caused by unsteady potential in a predetermined portion.

Figure 8A:
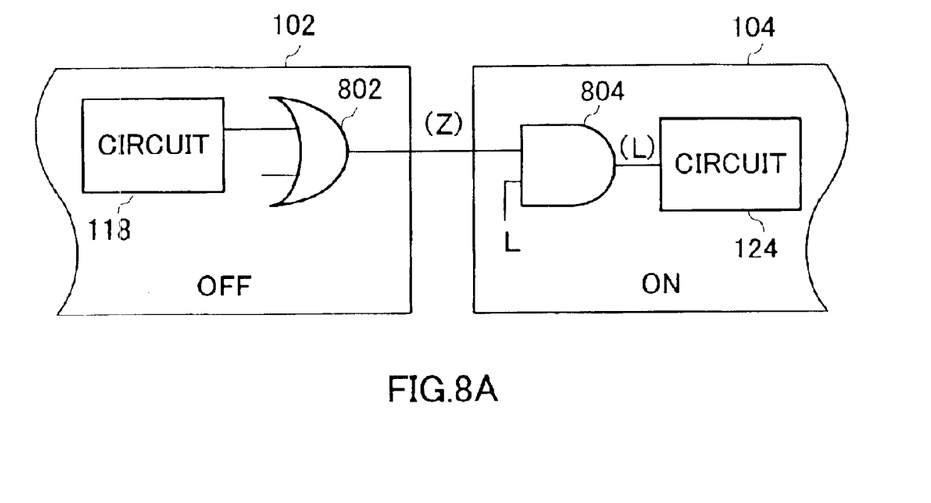
Figure 8B:
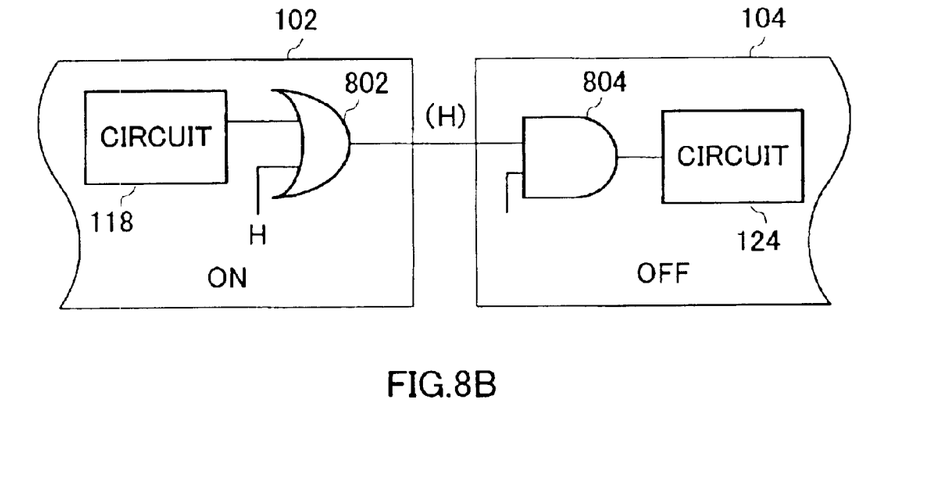
FIG. 8B is a diagram to illustrate the another example of a configuration of a pair of gate circuits composing an inter-block interface circuit and characteristic circuitry operation in the case where the power supply of a block that transmits a signal is switched on and the power supply of a block that receives the signal is switched off.

In a pair of gate circuits as shown in FIGS. 8A and 8B, OR gate 802 and AND gate 804 are used as the pair of gate circuits.

In FIG. 8A, one input level of AND gate 804 is fixed to "L", and as a result, an output level of AND gate 804 is fixed to "L".

In FIG. 8B, one input level of OR gate 802 is fixed to "H", and as a result, an output level of OR gate 802 is fixed to "H".

Figure 9A:
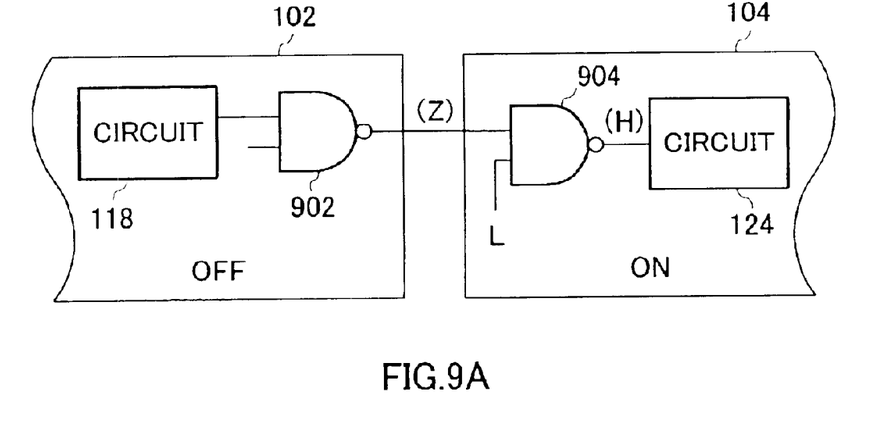
Figure 9B:
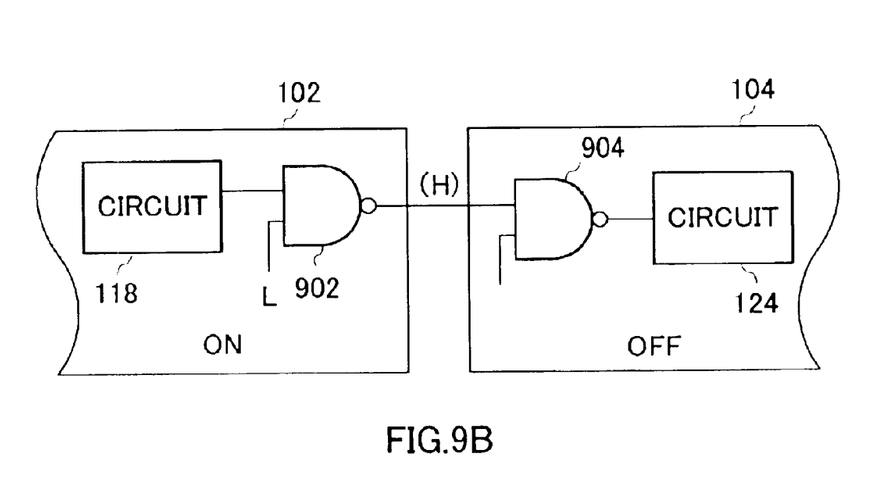
FIG. 9B is a diagram to illustrate the another example of a configuration of a pair of gate circuits composing an inter-block interface circuit and characteristic circuitry operation in the case where the power supply of a block that transmits a signal is switched on and the power supply of a block that receives the signal is switched off.

In a pair of gate circuits as shown in FIGS. 9A and 9B, NAND gate 902 and NAND gate 904 are used as the pair of gate circuits.

In FIG. 9A, one input level of NAND gate 904 is fixed to "L", and as a result, an output level of NAND gate 904 is fixed to "H".

In FIG. 9B, one input level of NAND gate 902 is fixed to "L", and as a result, an output level of NAND gate 902 is fixed to "H".

Figure 10A:
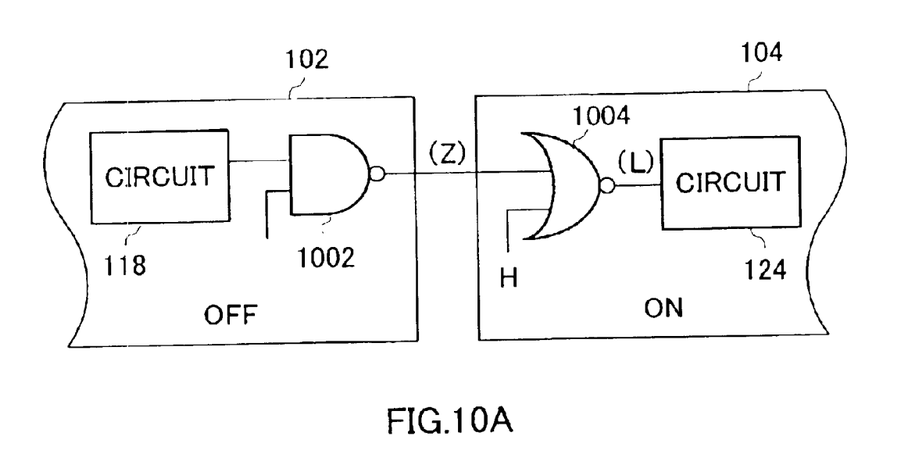
Figure 10B:
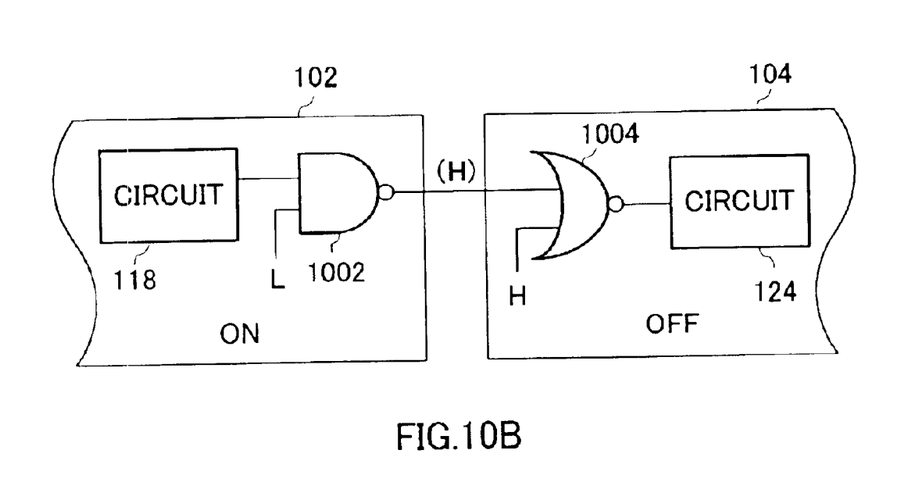
FIG. 10B is a diagram to illustrate the another example of a configuration of a pair of gate circuits composing an inter-block interface circuit and characteristic circuitry operation in the case where the power supply of a block that transmits a signal is switched on and the power supply of a block that receives the signal is switched off.

In a pair of gate circuits as shown in FIGS. 10A and 10B, NAND gate 1002 and NOR gate 1004 are used as the pair of gate circuits.

In FIG. 10A, one input level of NOR gate 1004 is fixed to "H", and as a result, an output level of NOR gate 1004 is fixed to "L".

In FIG. 10B, one input level of NAND gate 1002 is fixed to "L", and as a result, an output level of NAND gate 1002 is fixed to "H".

Figure 11A:
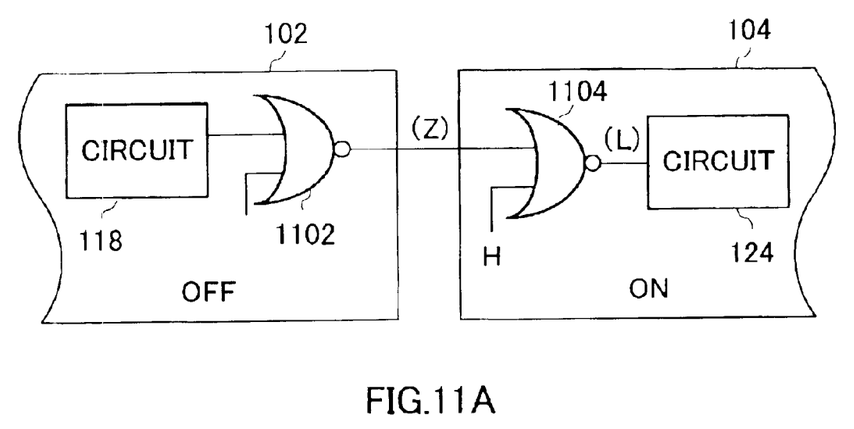
Figure 11B:
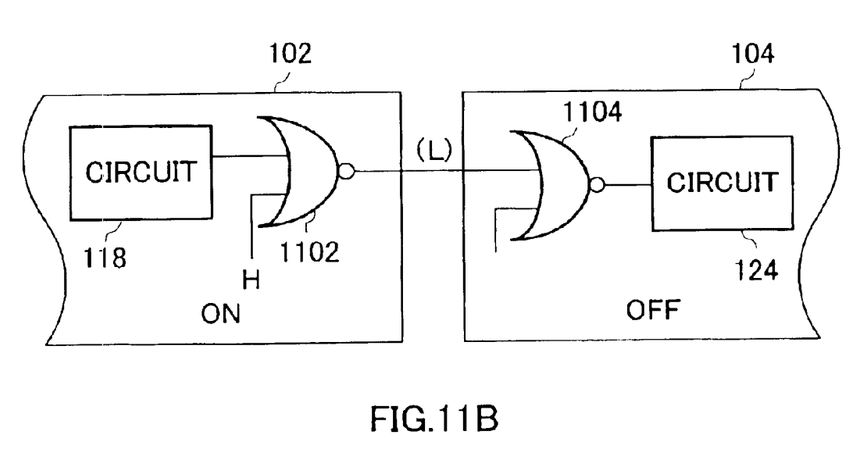
FIG. 11B is a diagram to illustrate the another example of a configuration of a pair of gate circuits composing an inter-block interface circuit and characteristic circuitry operation in the case where the power supply of a block that transmits a signal is switched on and the power supply of a block that receives the signal is switched off.

In a pair of gate circuits as shown in FIGS. 11A and 11B, NOR gate 1102 and NOR gate 1104 are used as the pair of gate circuits.

In FIG. 11A, one input level of NOR gate 1104 is fixed to "H", and as a result, an output level of NOR gate 1104 is fixed to "L".

In FIG. 11B, one input level of NOR gate 1102 is fixed to "H", and as a result, an output level of NOR gate 1102 is fixed to "L".

Figure 12A:
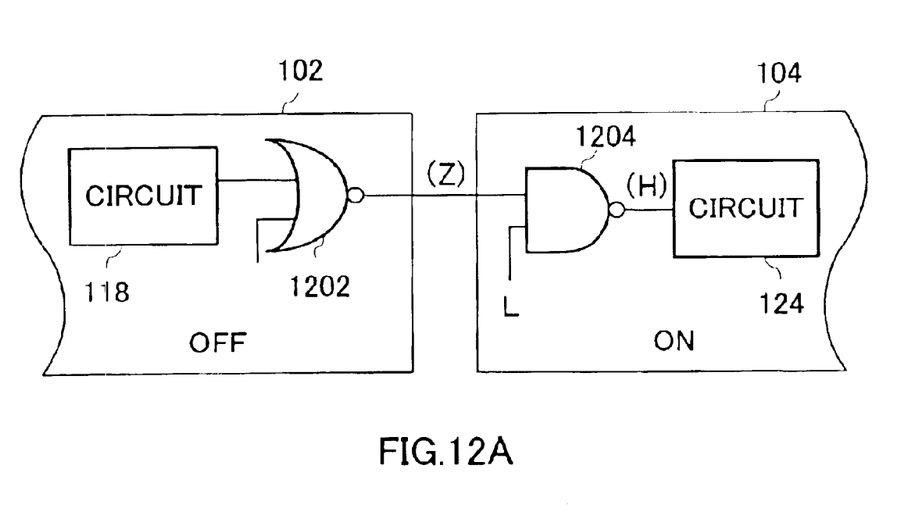
Figure 12B:
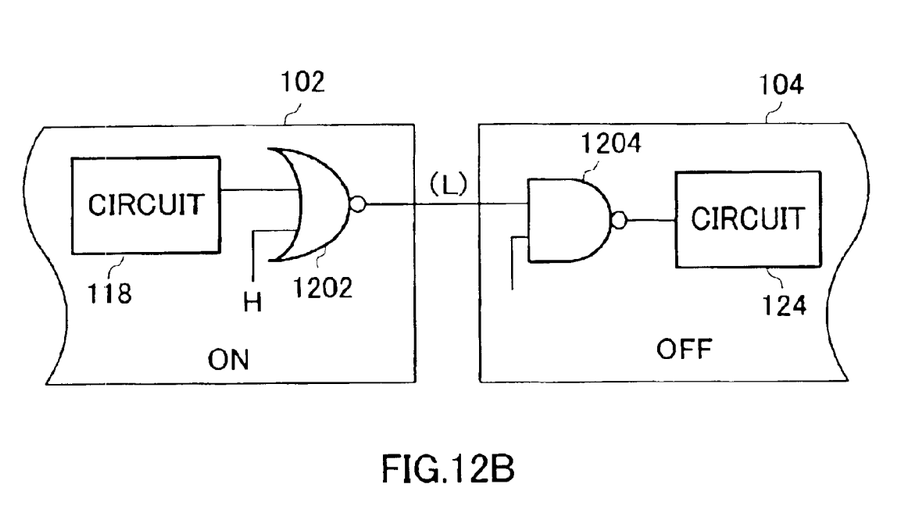
FIG. 12B is a diagram to illustrate the another example of a configuration of a pair of gate circuits composing an inter-block interface circuit and characteristic operation in the case where the power supply of a block that transmits a signal is switched on and the power supply of a block that receives the signal is switched off.

In a pair of gate circuits as shown in FIGS. 12A and 12B, NOR gate 1202 and NAND gate 1204 are used as the pair of gate circuits.

In FIG. 12A, one input level of NAND gate 1204 is fixed to "L", and as a result, an output level of NAND gate 1204 is fixed to "H".

In FIG. 12B, one input level of NOR gate 1202 is fixed to "H", and as a result, an output level of NOR gate 1202 is fixed to "L".

In terms of effects of preventing occurrences of shoot-through current, there are no differences between circuit structures. However, the transistor circuitry often uses a transistor with a source-based (in bipolar transistor, emitter-based) output, and in this case, an output level is inverse to an input level.

Accordingly, by using a combination of negative logic gates such as NOR and NAND instead of using positive logic gates such as OR and AND, signals do not need to be inverted in an inverter, and it is thus possible to decrease the number of gates (the number of transistors).

As described above, according to the present invention, in LSI where signals are communicated between blocks and the power supply of each block is interrupted independently, it is possible to prevent occurrences of inconveniences caused by switching off the power supply of the block (such as, for example, occurrences of the shoot-through current caused by unsteady potential of wiring) effectively using simple circuitry.

In other words, the configuration of the inter-block interface circuit of the present invention is simple, eliminates the need of providing separately a power supply that is always ON by using the power supply of the block, and thus prevents both increases in chip size due to lead wiring and increases in power consumption.

By using the inter-block interface circuit of the present invention, it is possible to dynamically vary ON/OFF of power supplies of a plurality of blocks packaged on system LSI for each block with no fears of inconveniences such as occurrences of shoot-through current, thereby enabling effective reduction in power consumption.

The present invention is not limited to the above described embodiments, and various variations and modifications may be possible without departing from the scope of the present invention.

This application is based on the Japanese Patent Application No. 2002-202850 filed on Jul. 11, 2002, entire content of which is expressly incorporated by reference herein.

What is claimed is:

1. An inter-block interface circuit that is provided to prevent an occurrence of unsteady potential state in a predetermined portion on a signal path on which a signal is communicated between a plurality of different types of blocks packaged on a substrate in controlling for each block ON/OFF of power supplies of the plurality of different types of blocks, comprising:

a pair of gate circuits comprised of a first gate circuit which is provided in a first block that transmits a signal and which operates by a power supply of the first block, and a second gate circuit which is provided in a second block that receives the signal and which operates by a power supply of the second block; and a circuit that has a function of compulsively fixing an input level of the first gate circuit or the second gate circuit respectively provided in the first block or the second block whose power supply is ON, using the power supply of the block which is ON, when the power supply of either the first block or the second block is ON and the other power supply is OFF, and thus compulsively fixing potential of an output terminal of the gate circuit.

2. The inter-block interface circuit according to claim 1, wherein the circuit that has the function of compulsively fixing potential of an output terminal of the gate circuit is provided in each of the first block and the second block, detects ON of the power supply of the first block or the second block, and compulsively fixes an input level of the first gate circuit or the second circuit, respectively.

3. The inter-block interface circuit according to claim 1, wherein the circuit that has the function of compulsively fixing potential of an output terminal of the gate circuit monitors ON/OFF of the power supply in the first block or the second block, and supplies a signal to fix at least one input level of the pair of gate circuits provided in the block whose power supply is ON.

4. The inter-block interface circuit according to claim 1, wherein the circuit that has the function of compulsively fixing potential of an output terminal of the gate circuit has both a function of a power supply control circuit that controls ON/OFF of the power supply of the first block or the second block and a function of supplying a signal to fix at least one input level of the pair of gate circuits provided in the block whose power supply is ON.

5. The inter-block interface circuit according to claim 1, wherein the pair of gate circuits is composed of either a pair of NOR gates, a pair of OR gates, a pair of AND gates, a pair of NAND gates, a pair of NOR gates and NAND gates, and a pair of an OR gate and AND gate.

6. A system LSI that controls ON/OFF of power supplies of a plurality of different types of blocks packaged on a substrate independently for each block and has no power supply that is always ON, wherein the system LSI prevents an occurrence of unsteady potential state in a predetermined portion on a signal path on which the plurality of blocks mutually communicate a signal, using the inter-block interface circuit according to claim 1.

* * * * *